United States Patent
Apalkov et al.

(10) Patent No.: US 10,177,197 B2
(45) Date of Patent: Jan. 8, 2019

(54) MAGNETIC JUNCTIONS HAVING ELONGATED FREE LAYERS

(71) Applicant: Samsung Electronics Co., LTD., Gyeonggi-do (KR)

(72) Inventors: Dmytro Apalkov, San Jose, CA (US); Shuxia Wang, San Jose, CA (US); Jang-Eun Lee, Cupertino, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 247 days.

(21) Appl. No.: 15/043,349

(22) Filed: Feb. 12, 2016

(65) Prior Publication Data
US 2017/0140804 A1 May 18, 2017

Related U.S. Application Data

(60) Provisional application No. 62/255,994, filed on Nov. 16, 2015.

(51) Int. Cl.
*H01L 27/22* (2006.01)
*G11C 11/16* (2006.01)
(Continued)

(52) U.S. Cl.
CPC .............. *H01L 27/22* (2013.01); *G11C 11/16* (2013.01); *G11C 11/161* (2013.01);
(Continued)

(58) Field of Classification Search
CPC ....... G11C 11/16; G11C 11/161; H01L 43/02; H01L 43/08; H01L 43/10; H01L 27/222; H01L 27/22; H01L 27/224
See application file for complete search history.

(56) References Cited

U.S. PATENT DOCUMENTS 6,958,927 B1 * 10/2005 Nguyen ................. G11C 11/16
                                                        257/295
7,697,243 B1    4/2010 Novosad
(Continued)

FOREIGN PATENT DOCUMENTS

CN        1305033      3/2007
CN      102522094      6/2012

OTHER PUBLICATIONS

Charles Eyrich, Exchange Stiffness in Thin-Film Cobalt Alloys, Nov. 29, 2012, M.S. Thesis, Simon Fraser University, Canada, pp. 25-29, 41-44.*

(Continued)

*Primary Examiner* — Eduardo A Rodela
(74) *Attorney, Agent, or Firm* — Van Pelt, Yi & James LLP

(57) ABSTRACT

A magnetic junction usable in a magnetic device is described. The magnetic junction has a free layer, a reference layer, and a nonmagnetic spacer layer between reference and free layers. The free layer is switchable between stable magnetic states when a write current is passed through the magnetic junction. The free layer has a length in a first direction, a width in a second direction perpendicular to the first direction, an exchange stiffness and an aspect ratio equal to the length divided by the width. The aspect ratio is greater than one. The exchange stiffness is not less than $2\times10^{-6}$ erg/cm.

20 Claims, 5 Drawing Sheets

(51) Int. Cl.
*H01L 43/02* (2006.01)
*H01L 43/08* (2006.01)
*H01L 43/10* (2006.01)
*G11C 11/56* (2006.01)
*H01F 10/32* (2006.01)

(52) U.S. Cl.
CPC ...... *G11C 11/1675* (2013.01); *G11C 11/5607* (2013.01); *H01F 10/329* (2013.01); *H01F 10/3259* (2013.01); *H01L 27/222* (2013.01); *H01L 27/224* (2013.01); *H01L 43/02* (2013.01); *H01L 43/08* (2013.01); *H01L 43/10* (2013.01)

(56) References Cited

U.S. PATENT DOCUMENTS

| | | | |
|---|---|---|---|
| 7,893,470 | B2 | 2/2011 | Worledge |
| 8,064,245 | B2 | 11/2011 | Prejbeanu |
| 8,089,829 | B2 | 1/2012 | Akagi |
| 8,367,228 | B2 | 2/2013 | Sonobe et al. |
| 8,704,319 | B2 * | 4/2014 | Tang ............ H01L 43/08 257/421 |
| 9,070,870 | B2 | 6/2015 | Zhu |
| 9,082,534 | B2 | 7/2015 | Chepulskyy |
| 9,129,690 | B2 * | 9/2015 | Park ............ G11C 11/161 |
| 2007/0085068 | A1 * | 4/2007 | Apalkov ............ B82Y 25/00 257/1 |
| 2009/0224342 | A1 * | 9/2009 | Nakayama ............ B82Y 25/00 257/421 |
| 2013/0075845 | A1 | 3/2013 | Chen |
| 2014/0247043 | A1 | 9/2014 | Klein |
| 2014/0287268 | A1 | 9/2014 | Weller |
| 2015/0061050 | A1 * | 3/2015 | Zhou ............ G11C 11/161 257/421 |
| 2015/0194963 | A1 | 7/2015 | Manipatruni |
| 2016/0125924 | A1 * | 5/2016 | Kita ............ G11C 11/161 365/158 |
| 2016/0190432 | A1 * | 6/2016 | Shum ............ H01L 43/02 257/427 |

OTHER PUBLICATIONS

Woojin Kim, J. H. Jeong, et al., "Extended scalability of perpendicular STT-MRAM towards sub-20nm MTJ node," IEEE International Electron Devices Meeting (IEDM) Dec. 10-12, 2011.

P. Mazalski, I. Sveklo, Z. Kurant, K. Ollefs, A. Rogalev, F. Wilhelm, J. Fassbender, L. T. Baczewski, A. Wawro and A. Maziewski, "XAS and XMCD studies of magnetic properties modifications of Pt/Co/Au and Pt/Co/Pt trilayers induced by Ga+ ions irradiation," J. Synchrotron Rad., vol. 22, No. 3, pp. 753-759, DOI:10.1107/S1600577515002933, May 31, 2015.

I. L. Prejbeanu, S. Bandiera, J. Alvarez-Herault, R. C. Sousa, B. Dieny, and J. P. Nozieres, "Thermally assisted MRAMs: ultimate scalability and logic functionalities," J. Phys. D: Appl. Phys., vol. 46, No. 7, 074002, DOI: 10.1038/0022-3727/46/7/074002, Feb. 20, 2013.

\* cited by examiner

MAGNETIC JUNCTIONS HAVING ELONGATED FREE LAYERS

CROSS-REFERENCE TO RELATED APPLICATIONS

This application claims the benefit of provisional Patent Application Ser. No. 62/255,994, filed Nov. 16, 2015, entitled ELONGATED PMA CELL FOR ADVANCED SCALABILITY, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, a conventional magnetic tunneling junction (MTJ) may be used in a conventional STT-MRAM. The conventional MTJ includes a conventional pinned, or reference, layer, a conventional free layer and a conventional tunneling barrier layer between the conventional reference and free layers. The conventional MTJ may include a conventional antiferromagnetic (AFM) layer.

The conventional reference layer and the conventional free layer are magnetic. The magnetization of the conventional reference layer is fixed, or pinned, in a particular direction. The conventional free layer has a changeable magnetization. The conventional free layer may be a single layer or include multiple layers. The reference layer and free layer may have their magnetizations oriented perpendicular to the plane of the layers (perpendicular-to-plane) or in the plane of the layers (in-plane).

To switch the magnetic moment of the conventional free layer, a current is driven through the conventional MTJ in a current-perpendicular-to-plane (CPP) direction. This current is spin polarized by the reference layer. When a sufficient current is driven through the conventional magnetic junction in a CPP configuration, the magnetic moment of the free layer may be switched to be parallel to or antiparallel to the reference layer magnetic moment. The differences in magnetic configurations correspond to different magnetoresistances and thus different logical states (e.g. a logical "0" and a logical "1") of the conventional MTJ.

Because of their potential for use in a variety of applications, research in magnetic memories is ongoing. Mechanisms for improving the performance of STT-RAM are desired. For example, magnetic junctions that are thermally stable at equilibrium (when not being written) and which can be programmed at a relatively modest write current are desired. Further, a sufficiently high magnetoresistance is useful for reading the state of the magnetic junction. These features are desired to be preserved for smaller magnetic junction sizes and higher areal density memories. Accordingly, what is needed is a method and system that may improve the performance of the spin transfer torque based memories.

BRIEF SUMMARY OF THE INVENTION

A magnetic junction usable in a magnetic device is described. The magnetic junction has a free layer, a reference layer, and a nonmagnetic spacer layer between reference and free layers. The free layer is switchable between stable magnetic states when a write current is passed through the magnetic junction. The free layer has a length in a first direction, a width in a second direction perpendicular to the first direction, an exchange stiffness and an aspect ratio equal to the length divided by the width. The aspect ratio is greater than one. The exchange stiffness is not less than $2 \times 10^{-6}$ erg/cm.

DETAILED DESCRIPTION OF THE INVENTION

Figure 1:
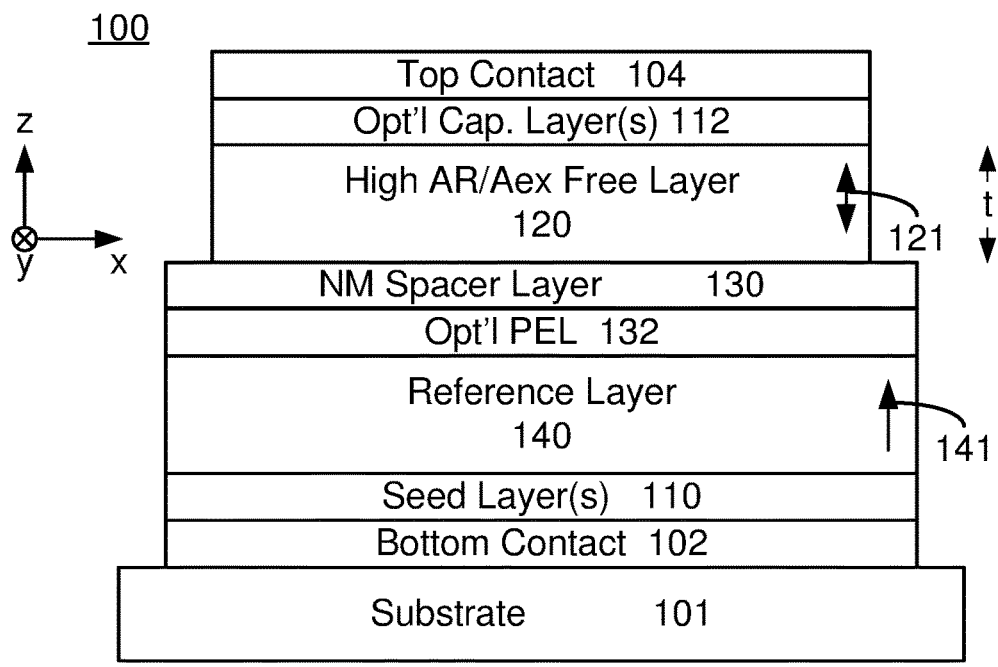
FIGS. 1-2 depict side and plan views of an exemplary embodiment of a magnetic device including magnetic junctions programmable using spin transfer and having an elongated free layer.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tablets, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps, substeps and/or steps in different orders that are not inconsistent with the exemplary embodiments. Thus, the present invention is not intended to be limited to the embodiments shown, but is to be accorded the widest scope consistent with the principles and features described herein.

A magnetic junction usable in a magnetic device and methods for providing the magnetic memory are described. The magnetic junction has a free layer, a reference layer, and a nonmagnetic spacer layer between reference and free layers. The free layer is switchable between stable magnetic states when a write current is passed through the magnetic junction. The free layer has a length in a first direction, a width in a second direction perpendicular to the first direction, an exchange stiffness and an aspect ratio equal to the length divided by the width. The aspect ratio is greater than one. The exchange stiffness is not less than $2 \times 10^{-6}$ erg/cm.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions having particular layers. However, one of ordinary skill in the art will readily recognize that magnetic junctions having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

Figure 2:
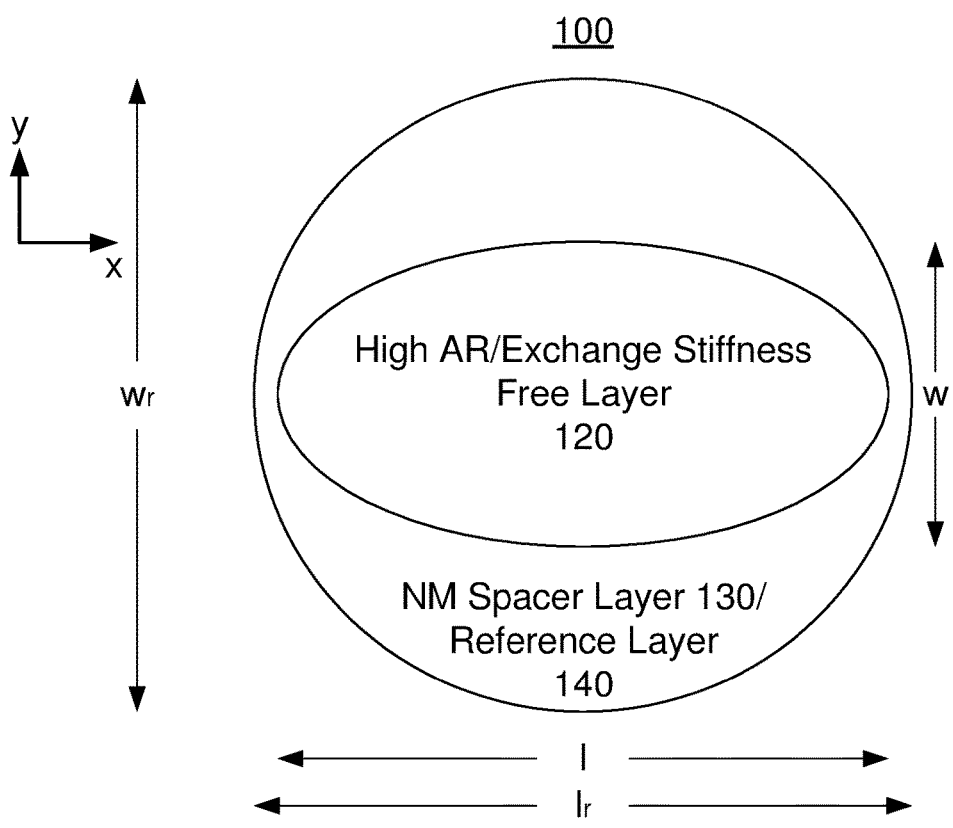

FIGS. 1-2 depict side and plan views an exemplary embodiment of a magnetic junction 100 including usable in a magnetic memory, programmable using spin transfer torque and having an elongated free layer. For clarity, FIGS. 1 and 2 are not to scale. The magnetic junction 100 may be used in a magnetic device such as a STT-RAM and, therefore, in a variety of electronic devices.

The magnetic junction 100 includes a free layer 120 having magnetic moment 121, a nonmagnetic spacer layer 130 and a reference layer 140 having magnetic moment 141. Also shown is an underlying substrate 101 in which devices including but not limited to a transistor may be formed. The magnetic junction 100 may also include optional polarization enhancement layer (PEL) 132 has a high spin polarization. For example, the PEL 132 might include Fe and/or CoFe. Bottom contact 102, top contact 104, optional seed layer(s) 110 and optional capping layer(s) 112 are also shown. For example, the seed layer(s) 110 may include a thin, crystalline MgO seed layer having a 200 orientation. Such an MgO layer may enhance the perpendicular magnetic anisotropy (PMA) of the adjacent reference layer 140. Similarly the capping layer(s) 112 may include a thin, crystalline 200 MgO layer to enhance the PMA of the adjacent free layer 120. In the embodiment shown, the reference layer 140 is closer to the substrate than the layer 120. The magnetic junction 100 is, therefore, a bottom pinned junction. Although the layers 120, 130, 132 and 140 are shown with a particular relationship to the substrate 101, in other embodiments, the order may differ. For example, in another embodiment, from closest to furthest from the substrate 101, the layers may be 120, 130, 132 (if present) and 140. The magnetic junction 100 may, therefore, be a top pinned magnetic junction. In alternate embodiments, the magnetic junction 100 could be a dual magnetic junction that includes an additional reference layer and a nonmagnetic spacer layer between the free layer 120 and the additional reference layer (not shown).

An optional pinning layer (not shown) may be used to fix the magnetization (not shown) of the reference layer 140. The optional pinning layer may be an AFM layer or multilayer that pins the magnetization (not shown) of the reference layer 140 by an exchange-bias interaction. However, in other embodiments, the optional pinning layer may be omitted or another structure may be used.

Other layers including but not limited to other PELs having a high spin polarization, magnetic or nonmagnetic insertion layers, and/or other layers may be included in the layers of the magnetic junction 100 or be considered to be separate layers that may be used in the magnetic junction 100. However, only one such layer 132 is shown for simplicity. The magnetic junction 100 is configured such that the free layer is switchable between a plurality of stable magnetic states using a write current is passed through the magnetic junction 100. Thus, the free layer 120 is programmable using spin transfer torque.

The nonmagnetic spacer layer 130 is between reference layer 140 and the free layer 120. The nonmagnetic spacer layer 130 may be an MgO tunneling barrier layer. The MgO layer may be crystalline and have a 200 orientation for enhanced tunneling magnetoresistance (TMR). In other embodiments, the nonmagnetic spacer layer 130 may be a different tunneling barrier layer, may be a conductive layer or may have another structure.

The reference layer 140 is magnetic. The reference layer 140 may be a multilayer. The reference layer 140 may be a synthetic antiferromagnet including multiple ferromagnetic layers interleaved with and sandwiching nonmagnetic layer (s) such as Ru. Thus, the reference layer 140 layer may also include sublayers including but not limited to multiple ferromagnetic layers. The PEL 132 having a high spin polarization is provided at the portion of the reference layer 140 nearest to the nonmagnetic spacer layer 130. In other embodiments, the PEL 132 may be omitted.

The PMA energy of the reference layer 140 exceeds its out-of-plane demagnetization energy in the embodiment shown. The reference layer 140 thus has a high PMA. As used herein a high PMA is a PMA such that the PMA energy is greater than the out-of-plane demagnetization energy. Because the reference layer 140 has a high PMA, the magnetic moment 141 of the reference layer 140 may be perpendicular-to-plane (along the z-direction as shown-in the direction shown in FIG. 1 or antiparallel to the direction shown in FIG. 1). In such embodiments, a pinning layer is generally not used. For example, the reference layer 140 may include a multilayer including multiple repeats of a Co/Pt bilayer, a CoPt alloy, a CoTb alloy and/or multiple repeats of a Co/Tb bilayer. Such combinations may have a high PMA. Similarly, the reference layer 140 may include one or more of CoFeB, FeB, CoB, Fe, $Co_2FeAl$, $Co_2FeAlSi$, $Co_2MnSi$ and MnAl, which may have a high PMA. Note that as used herein CoFeB, FeB, CoB and MnAl denote alloys in which the stoichiometry is not indicated. For example, CoFeB may include $(CoFe)_{1-x}B_x$, where x is greater than or equal to zero and less than or equal to 0.5. For example, x may be at least 0.2 and not more than 0.4. Similarly, FeB may be $Fe_{1-x}B_x$, where x is greater than or equal to zero and less than or equal to 0.5. Other materials and/or structures are having a high PMA possible for the reference layer 140. In other embodiments, the magnetic moment 141 of the reference layer 140 may be in-plane.

In the embodiment shown, the reference layer 140 need not be elongated. The length $l_r$ of the reference layer 140 is substantially the same as the width, $w_r$ ($w_r \approx l_r$). Thus, aspect ratio of the reference layer may be near or equal to one. As used herein, the aspect ratio is the in-plane and equal to one dimension in plane divided by the other dimension (e.g. length divided by width). In other embodiments, the reference layer may be elongated. For example, the reference layer 140 may be elongated in the same direction as the free layer 120 ($l_r>w_r$). Alternatively, the reference layer 140 may be elongated in a different direction ($l_r<w_r$). In addition, the reference layer 140 is shown as longer and wider than the free layer 120 ($l_r>l$, $w_r>w$). In other embodiments, the reference layer 140 may be the same size as, narrower and/or not as long as the free layer 120.

The free layer 120 is magnetic and has a PMA energy that exceeds the out-of-plane demagnetization energy when the magnetic junction 100 is in the quiescent state. In other words, when no write current is applied to the magnetic junction 100, the PMA energy is greater than the out-of-plane demagnetization energy. The free layer 120 thus has a high PMA. The magnetic moment 121 of the free layer 120 may be oriented perpendicular-to-plane as shown in FIG. 1 (in the + or −z direction). The magnetic junction is also configured such that the magnetic moment 121 of the free layer 120 may be switched using a write current driven through the magnetic junction (e.g. using spin transfer).

The free layer 120 and thus the magnetic junction 100 are suitable for use in higher density magnetic memory applications. To be used in such applications, the free layer 120 has smaller dimensions and is thermally stable at equilibrium. Equilibrium occurs when the magnetic junction 100 is quiescent (not being written). Further, the width of the free layer 120, w, does not exceed twenty nanometers. In some embodiments, w does not exceed sixteen nanometers.

In order for the free layer 120 to be thermally stable when the magnetic junction 100 is quiescent, the thermal stability constant, Δ, for the free layer 120 may be at least one hundred (Δ≥100). In other embodiments, the desired Δ for thermal stability may differ. Δ is given by $K_uV/k_bt$, where $K_u$ is a magnetic anisotropy density, $k_b$ is Boltzman's constant, T is temperature in Kelvin and V is the volume of the free layer 120. Thus, $\Delta \sim K_u tA$, where A is the area of the footprint of the free layer 120 (in the x-y plane) and t is the thickness. Note that the area can be approximated by wl, where w and l are the width and length, respectively, of the free layer 120. In some embodiments, the thickness, t, of the free layer 120 is desired to be kept relatively low. For example, t may not be more than three nanometers. In some embodiments, t does not exceed two nanometers. In some such embodiments, t is at least 1.5 nanometers. Thus, $\Delta \sim (K_u t)wl$, where $K_u t$ is substantially constant for the free layer 120 of a given thickness. As discussed above, the width, w, of the free layer 120 may be desired to be less than or equal to twenty nanometers. However, the length, l, may have some freedom for selection of the desired value. Thus, the value of Δ for the free layer 120 may be increased by elongating the free layer. Stated differently, the free layer 120 may have an aspect ratio (AR) greater than one for improved thermal stability. In some embodiments, the AR for the free layer 120 is at least two. In some such embodiments, the aspect ratio is greater than two. Note that the critical current (write current required to program the magnetic junction) may be independent of free layer length, l, for the same Δ. Thus, the AR of the free layer 120 may be increased in order to improve thermal stability of the free layer 120 without increasing the required write current.

If the aspect ratio of the free layer 120 were merely increased, the switching of the magnetic junction 100 may become nonuniform. More specifically, at some size (termed the "critical size" herein), the switching of the free layer 120 is no longer uniform. In such a regime, Δ may no longer follow the relationship ($\Delta \sim K_u t$) described above. In order to address this issue, the exchange stiffness, $A_{ex}$, may be configured. Thus, in addition to having an aspect ratio greater than one, the $A_{ex}$ of the free layer 120 may be increased to allow for the desired thermal stability and operation at smaller sizes and higher memory densities.

The exchange stiffness, $A_{ex}$, depends upon various factors, including the selection of material(s) for the free layer 120. Some magnetic materials have a high exchange stiffness. As used herein, a high exchange stiffness is at least $2\times 10^{-6}$ erg/cm. For example, elemental Fe, elemental Co, $SmCo_5$, MnGe, $Co_2FeSi$, $Co_2MnSi$, $Fe_xCo_{1-x}$ where x is at least 0.5 and less than 0.65 (and may be 0.53 or 0.63) may have a sufficiently high exchange stiffness. A reduced saturation magnetization material such as MnGe may be desirable to reduce the out-of-plane demagnetization energy. Thus, one or more of these materials may be used in the free layer 120. For example, the free layer 120 may be a multilayer including at least one layer of a high exchange stiffness material such as those mentioned above. In other embodiments, the free layer 120 may consist of one or more layers of the high exchange stiffness material(s). As used herein, a "high exchange stiffness free layer" is a free layer having an exchange stiffness of at least $2\times 10^{-6}$ erg/cm and including (or consisting of) one or more layers having an exchange stiffness of at least $2\times 10^{-6}$ erg/cm. In addition, the interfaces of the high exchange stiffness layer(s) are desired to be smooth. Smoother interfaces tend to increase exchange stiffness.

The high exchange stiffness layer(s) are also desired to be free of magnetic impurities such as glass-promoting components. One such component typically used in free layers is B. Consequently, if the high exchange stiffness layer(s) include a glass-promoting component such as B as-deposited, subsequent processing is desired to remove most or all of the glass-promoting component. Use of such a glass-promoting component in the as-deposited free layer 120 may be desirable for improving TMR and/or for other purposes.

Exchange stiffness also increases with thickness (t). Thus, the high exchange stiffness layer(s) may be on the order of two nanometers. In some embodiments, the high exchanges stiffness layer(s) may be approximately 1.8 nm. In such embodiments, the free layer 120 may consist of the high exchange stiffness layer(s). It is also noted that the RA for the magnetic junction 100 may be desired to be modest, for example less than approximately thirty Ohm/$\mu$m$^2$. In other embodiments, however, other ranges of RA are possible.

Figure 3A:
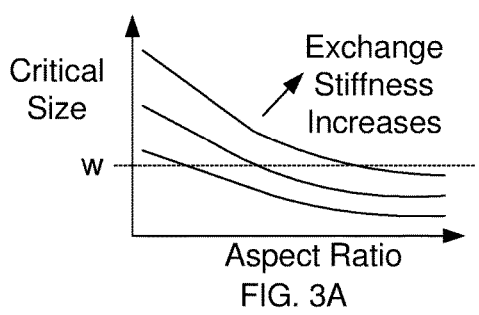
FIGS. 3A-3B depict exemplary embodiments of the relationship between size, thermal stability, aspect ratio and exchange stiffness.
Figure 3B:
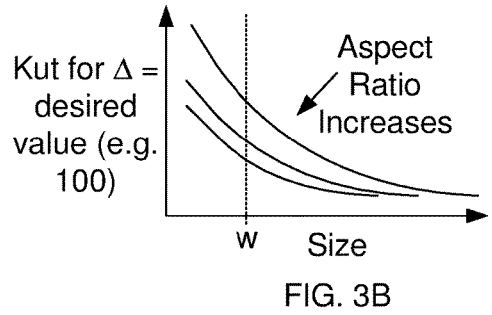

The selection of exchange stiffness and aspect ratio may be understood with reference to FIGS. 3A and 3B. FIGS. 3A and 3B depict exemplary embodiments of the relationship between size, thermal stability, aspect ratio and exchange stiffness for a free layer 120. FIG. 3A depicts the critical size versus aspect ratio for various exchange stiffnesses. As can be seen in FIG. 3A, for a particular critical size, the allowed aspect ratio increases for increasing exchange stiffness. As discussed above, the width of the free layer 120 is generally desired to exceed the critical size. Thus, for any aspect ratio, a higher exchange stiffness allows for greater freedom in reducing the width of the free layer 120 while increasing the aspect ratio. FIG. 3B depicts $K_u t$ (and thus $\Delta$) for a particular (desired) $\Delta$ versus width of the free layer 120 for various aspect ratios. As can be seen in FIG. 3B, for a particular width, an increased aspect ratio gives a higher $K_u t$. Thus, $\Delta$ is more easily maintained at the desired value for thermal stability for higher aspect ratios. As such, an increased aspect ratio and exchange stiffness may be desired.

Thus, for thermal stability at smaller sizes, the free layer 120 is desired to have an aspect ratio greater than one and an exchange stiffness not less than $2 \times 10^{-6}$ erg/cm. In some embodiments, the aspect ratio is at least two. In some such embodiments, the aspect ratio is at least three. Because the aspect ratio is greater than one, the free layer 120 is termed an elongated aspect ratio. The exchange stiffness for the free layer 120 is at least $2 \times 10^{-6}$ erg/cm. In some embodiments, the exchange stiffness is at least $3 \times 10^{-6}$ erg/cm. The free layer 120 may thus have a $\Delta$ of at least one hundred at smaller sizes. Thus, the width, w, may not exceed twenty nanometers and the thickness t may not exceed three nanometers. In some such embodiments, t is not more than two nanometers. At such small widths and thicknesses, for the aspect ratios and exchange stiffnesses described above, the free layer 120 may be thermally stable.

In operation, the free layer 120 has a high PMA. The $\Delta$ of the free layer 120 may sufficiently high for thermal stability due to the aspect ratio and exchange stiffness described above. For example, $\Delta$ may be at least one hundred. Thus, the free layer 120 is magnetically stable with its magnetic moment perpendicular-to-plane when the magnetic junction 110 is quiescent (not being read or programmed). The free layer 120 may be programmed by a write current driven in the CPP direction (i.e. along the z-axis). Depending upon the direction of the current, the free layer magnetic moment 121 may be parallel or antiparallel to the magnetic moment 141 of the reference layer 140. As discussed above, the aspect ratio of the free layer 120 being greater than one may not adversely affect the switching current. Thus, the magnetic junction 100 may be programmed via spin transfer torque.

The magnetic junction 100 may have improved performance for smaller sizes and/or higher memory densities. The free layer 120 and reference layer 140 may have their magnetic moments oriented perpendicular-to-plane, which may be desirable for improved performance. Because of the high PMA, aspect ratio and exchange stiffness, the free layer 120 is thermally stable when the magnetic junction 100 is quiescent. This is true even though the width of the free layer 120 may be sub-20 nanometer. As a result, the magnetic junction 100 may be used in higher memory density applications. Consequently, performance of the magnetic junction 100 and a magnetic memory using the magnetic junction 100 may be improved.

Figure 4:
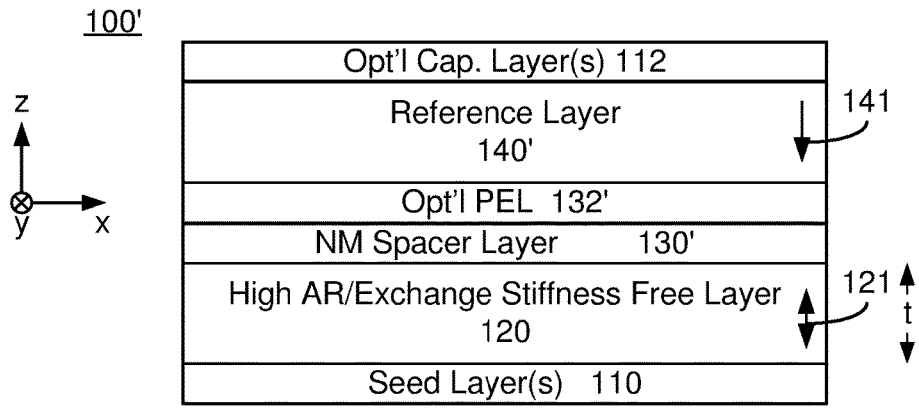
FIGS. 4-5 depict side and perspective views of an exemplary embodiment of a magnetic junction programmable using spin transfer and having an elongated free layer.
Figure 5:
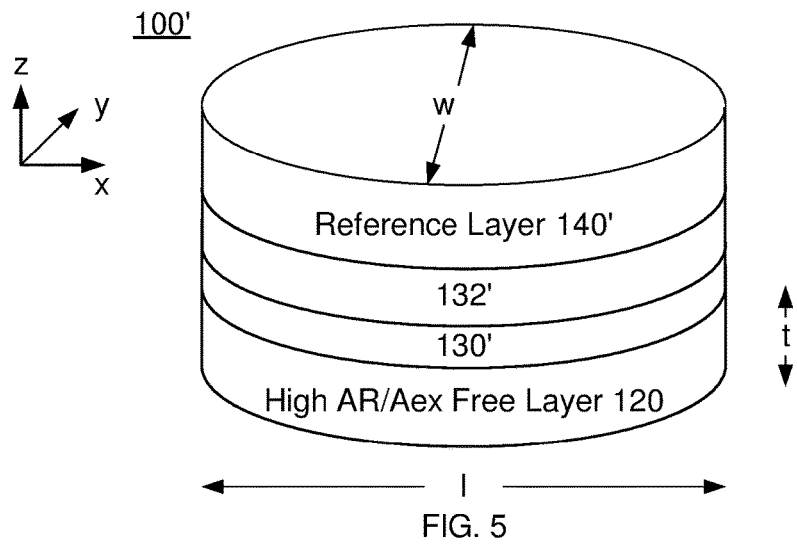

FIGS. 4-5 depict side and perspective views of an exemplary embodiment of a magnetic junction 100' programmable using spin transfer and having an elongated free layer. For clarity, FIGS. 4-5 are not to scale. The magnetic junction 100' may be used in a magnetic device such as a STT-RAM and, therefore, in a variety of electronic devices. The magnetic junction 100' is analogous to the magnetic junction 100. As a result, similar components have similar labels. The magnetic junction 100' includes an elongated free layer 120 having magnetic moment 121, a nonmagnetic spacer layer 130' and a reference layer 140' having magnetic moment 141 that are analogous to the free layer 120 having magnetic moment 121, the nonmagnetic spacer layer 130 and the reference layer 140 having magnetic moment 141, respectively, depicted in FIG. 1. Also shown are optional seed layer(s) 110, optional capping layer(s) 112, and optional PEL 132. Although not shown, an underlying substrate, bottom contact and top contact are analogous to the substrate 101, bottom contact 102 and top contact 104 shown in FIG. 1 might be included. In addition, one or more additional PELs (not shown) may be present. In addition, although it appears as though the free layer 120 would be closest to the substrate (not shown in FIG. 1) and the reference layer 140 furthest from the substrate, other relationships may be possible. For example, the reference layer 140 may be closest to the substrate and the free layer 120 may be furthest from the substrate.

In the embodiment shown in FIGS. 4-5, the free layer 120 has an aspect ratio, thickness, width, length and exchange stiffness analogous to those described above for the free layer 120. The reference layer 140', nonmagnetic spacer layer 130' and optional PEL 132' may also have the same structure and function as described above. In the embodiment shown, these layers share the footprint of the free layer 120. For example, the reference layer 140' may have the same width and length as the free layer 120. Thus, the reference layer 140' is an elongated reference layer. In some embodiments, both the reference layer 140' and the nonmagnetic spacer layer 130' share the footprint of the free layer 120. In the magnetic junction 100', any combination of the layers 130', 132' and/or 140' has the same aspect ratio and size as the free layer 120. Stated differently, the magnetic junction 100' shares the aspect ratio of the layer 120. Thus, the edges of the layers 120, 130', 132' and 140' may be defined together, using the same mask and ion milling process.

The magnetic junction 100' shares the benefits of the magnetic junction 100. Because the free layer 120 is elongated (aspect ratio greater than one) and has a high exchange stiffness (at least $2 \times 10^{-6}$ ergs/cm) the free layer 120 may be thermally stable when the magnetic junction 100' is not being written and for smaller sizes of the magnetic junction 100'. Thus, the magnetic junction 100' may be used in magnetic memories having a higher areal density and for smaller size applications. Further, a single masking process may be used to define the edges of all of the layers 120, 130 and 140. Thus, fabrication of the magnetic junction 100' may also be simplified.

Figure 6:
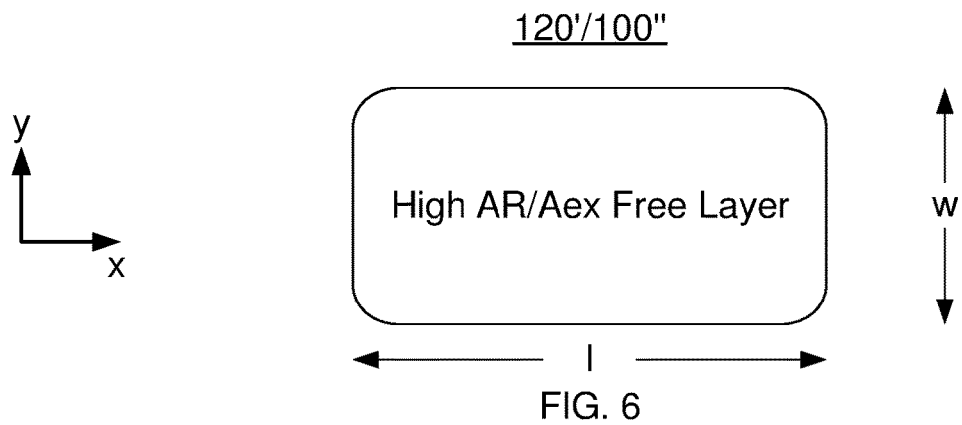
FIG. 6 depicts a plan view of an exemplary embodiment of a magnetic device including magnetic junctions programmable using spin transfer and having an elongated free layer.

FIG. 6 depicts a plan view of an exemplary embodiment of a magnetic junction 100" programmable using spin transfer and having an elongated free layer. For clarity, FIG. 6 is not to scale. The magnetic junction 100" may be used in a magnetic device such as a STT-RAM and, therefore, in a variety of electronic devices. The magnetic junction 100" is analogous to the magnetic junction(s) 100 and/or 100'. As a result, similar components have similar labels. However, because a plan view is depicted, only the free layer 120' is shown.

The free layer 120' is elongated and has a high exchange stiffness, as described above. The free layer 120 has an aspect ratio, thickness, width, length and exchange stiffness analogous to those described above for the free layer 120. The remaining layers (not shown) may be analogous to those depicted for the magnetic junction 100 and/or 100'. However, in the embodiment shown, the footprint of the free layer 120' in the x-y plane is not elliptical. In the embodiment shown, the free layer 120' has a footprint that is generally rectangular in shape. The remaining layers of the magnetic junction 100" may have the same or different aspect ratio and shape. In other embodiments, the footprint of the free layer 120' may have a different shape. However, the aspect ratio and exchange stiffness described above are desired to be maintained.

The magnetic junction 100" shares the benefits of the magnetic junction 100. Because the free layer 120' is elongated (aspect ratio greater than one) and has a high exchange stiffness (at least $2 \times 10^{-6}$ ergs/cm) the free layer 120' may be thermally stable when the magnetic junction 100" is not being written and for smaller sizes of the magnetic junction 100". Thus, the magnetic junction 100" may be used in magnetic memories having a higher areal density and for smaller size applications.

Figure 7:
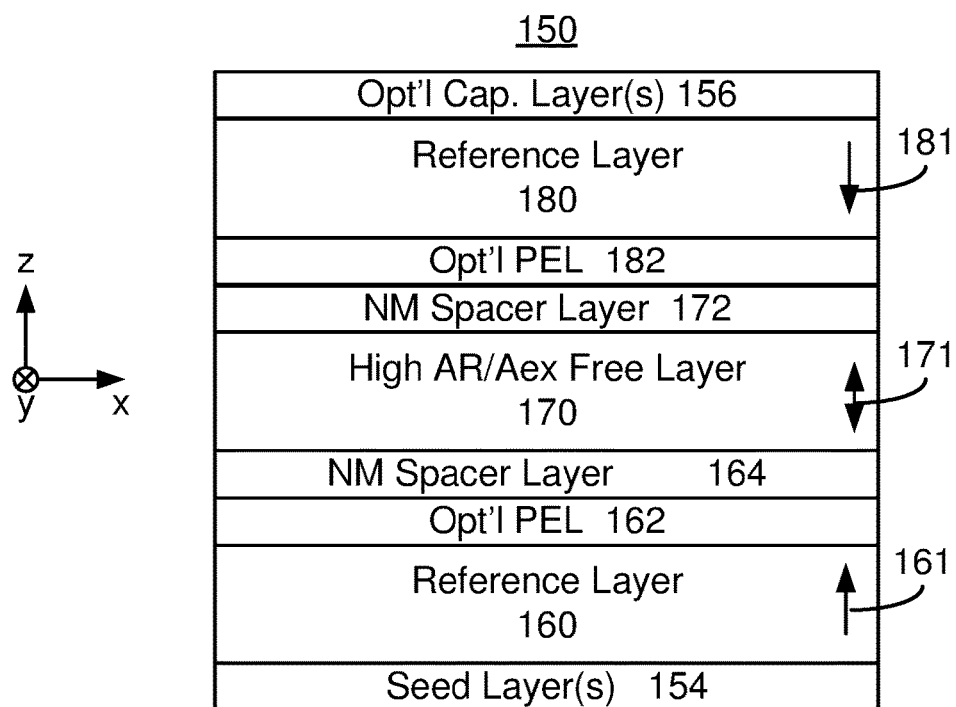
FIG. 7 depicts a side view of an exemplary embodiment of a magnetic junction programmable using spin transfer and having an elongated free layer.

FIG. 7 depicts another exemplary embodiment of a magnetic junction 150 including an elongated free layer that is usable in a magnetic memory programmable using spin transfer torque. For clarity, FIG. 7 is not to scale. The magnetic junction 150 may be used in a magnetic device such as a STT-RAM and, therefore, in a variety of electronic devices. The magnetic junction 150 is analogous to the magnetic junction(s) 100, 100' and/or 100". As a result, similar components have similar labels. The magnetic junction 150 includes an elongated free layer 170 having magnetic moment 171, a nonmagnetic spacer layer 172 and a reference layer 180 having magnetic moment 181 that are analogous to the free layer 120/120' having magnetic moment 121, the nonmagnetic spacer layer 130 and the reference layer 140 having magnetic moment 141, respectively, depicted in FIGS. 1-2, 4-5 and 6. The magnetic junction 150 also includes an additional reference layer 160 and an additional nonmagnetic spacer layer 164. One or both of the layers 164 and 172 may be insulating tunneling barrier layers. Also shown are optional seed layer(s) 154, optional capping layer(s) 156, and optional PELS 162 and 172. Although not shown, an underlying substrate, bottom contact and top contact are analogous to the substrate 101, bottom contact 102 and top contact 104 shown in FIG. 1 might be included. In addition, one or more additional PELs (not shown) may be present. The magnetic junction 150 is thus a dual magnetic junction.

The free layer 170 may have the exchange stiffness and aspect ratio of the free layer(s) 120 and/or 120'. In addition, the magnetic junction 150 is a dual magnetic junction. Although shown in a dual state (magnetic moment 181 antiparallel to the magnetic moment 161), in other embodiments, the magnetic junction 150 may be in the antidual state (magnetic moments 161 and 181 parallel).

The magnetic junction 150 shares the benefits of the magnetic junctions 100, 100' and/or 100". Because the free layer 170 has the aspect ratio and exchange stiffness as described above, the free layer 170 may be thermally stable at smaller sizes. Thus, the magnetic junction 100" may be used in magnetic memories having a higher areal density and for smaller size applications.

Figure 8:
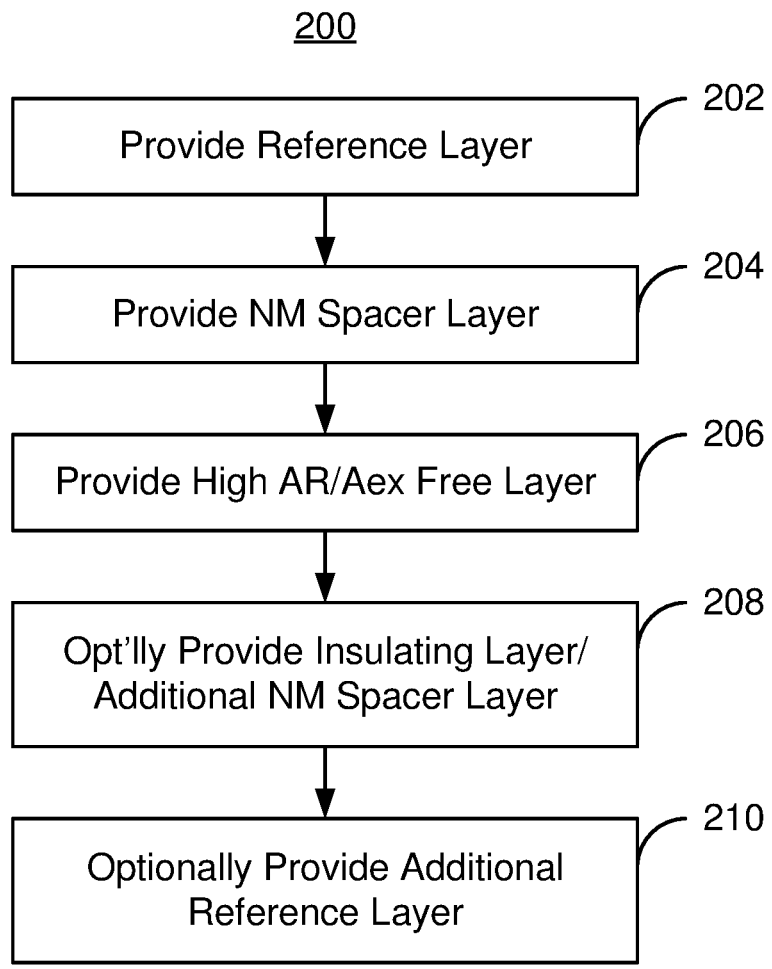
FIG. 8 is a flow chart depicting an exemplary embodiment of a method for providing a magnetic memory programmable using spin transfer torque and having an elongated free layer.

FIG. 8 depicts an exemplary embodiment of a method 200 for fabricating a magnetic junction including an elongated free layer and usable in a magnetic device such as an STT-RAM and, therefore, in a variety of electronic devices. For simplicity, some steps may be omitted, performed in another order, include substeps and/or combined. Further, the method 200 may start after other steps in forming a magnetic memory have been performed. For simplicity, the method 200 is described in the context of the magnetic junctions 100 and 150. However, other magnetic junctions, including but not limited to the magnetic junction(s) 100' and/or 100" may be formed.

A reference layer 140/160 that may have its PMA exceeding its out-of-plane demagnetization energy is provided substrate, via step 202. In some embodiments, step 202 may include providing a multilayer such as a SAF, a high PMA multilayer, and/or another multilayer.

A nonmagnetic spacer layer 130/164 is provided, via step 204. Step 204 may include depositing MgO, which forms a tunneling barrier layer. In some embodiments, step 204 may include depositing MgO using, for example, radio frequency (RF) sputtering. In other embodiments, metallic Mg may be deposited, then oxidized in step 204.

A free layer 120/170 is provided, via step 206. The nonmagnetic spacer layer 130/162 is between the reference layer 140/160 and the free layer 120/170. The PMA energy of the free layer 120/170 may be greater than its demagnetization energy at equilibrium (when the magnetic junction 100 is quiescent). Thus, the magnetic moment 121/171 may be perpendicular to plane. In addition, the free layer 120/170 has a high exchange stiffness of not less than $2 \times 10^{-6}$ erg/cm and an aspect ratio of greater than one. In some embodiments the aspect ratio may be at least two. The exchange stiffness may be at least $3 \times 10^{-6}$ erg/cm in some embodiments. In order to obtain the high exchange stiffness, fabrication of the free layer 120/170 in step 206 may include configuring processing conditions to optimize the exchange stiffness. For example, selection of the pressure of the gas used in sputtering the films for the free layer 120/170 may be made to increase the exchange stiffness. Fabrication of the free layer 120/170 may include steps to increase the density of the lattice, reduce the roughness of interfaces, and/or ensure that nonmagnetic glass-promoting components such as B are removed from the free layer 120/170. In addition, the aspect ratio of the free layer 120/170 may be set as part of step 206. Thus, the free layer 120/170 formed in step 208 may be elongated.

Step 206 may include testing the free layer 120/170 and/or magnetic junction 100/150 in order to determine that the exchange stiffness is sufficiently high. This portion of step 206 may occur later in fabrication, for example after the magnetic junction 100/150 has completed fabrication. For example, ferromagnetic resonance (FMR) may be used on non-circular patterned bits to directly determine the exchange stiffness of the free layer 120/170. Indirect measurements of exchange stiffness, such as the measurement of the Curie temperature ($T_c$) may also be used. Thus, step 206 may include ensuring that the free layer 120/170 has not only the desired aspect ratio, but also the desired exchange stiffness.

The additional nonmagnetic spacer layer 172 may optionally be provided, via step 208. Step 208 may include depositing MgO, which forms a tunneling barrier layer. In some embodiments, step 208 may include depositing MgO using, for example, radio frequency (RF) sputtering. In other embodiments, metallic Mg may be deposited, then oxidized in step 208. Step 208 may be omitted for the magnetic junction 100.

An additional reference layer 180 that may have its PMA exceeding its out-of-plane demagnetization energy may optionally be provided, via step 210. The nonmagnetic spacer layer 172 is between the reference layer 180 and the free layer 170. In some embodiments, step 210 may include providing a multilayer such as a SAF, a high PMA multilayer, and/or another multilayer.

In some embodiments steps 206 is performed before 204 and step 204 is performed before step 202. However, other orders are possible. For example, the order of steps may be 202, 204, 206, 208 (if performed) and 210 (if performed) as shown.

Fabrication of the magnetic junction 100/150 may be completed. This may include substeps interleaved with the remaining steps. For example, completing the magnetic junction 100/150 may include providing one or more PELs. One or more anneals may also be carried out during fabrication. In addition, the edges of the magnetic junction 100/150 may be defined. At least the free layer 120/170 has an aspect ratio greater than one. In some embodiments, more (or all) of the layers of the magnetic junction 100/150 have an aspect ratio greater than one. For example, a mask may be provided on the stack of layers for the magnetic junction 100/150. The mask covers region(s) to be formed into magnetic junctions 100 and has apertures over regions between the magnetic junctions. The mask has an elongated shape, such as the ellipse or rectangle shown in FIGS. 2, 5 and 6. An ion mill may then be performed. The regions between the magnetic junctions may be refilled and/or other structures formed. Thus, fabrication of the magnetic junction having the elongated free layer 120/170 is completed.

Using the method 200, the magnetic junction 100, 100', 100" and/or 150 may be formed. Thus, the benefits of the magnetic junction(s) 100, 100', 100" and/or 150 may be achieved.

Figure 9:
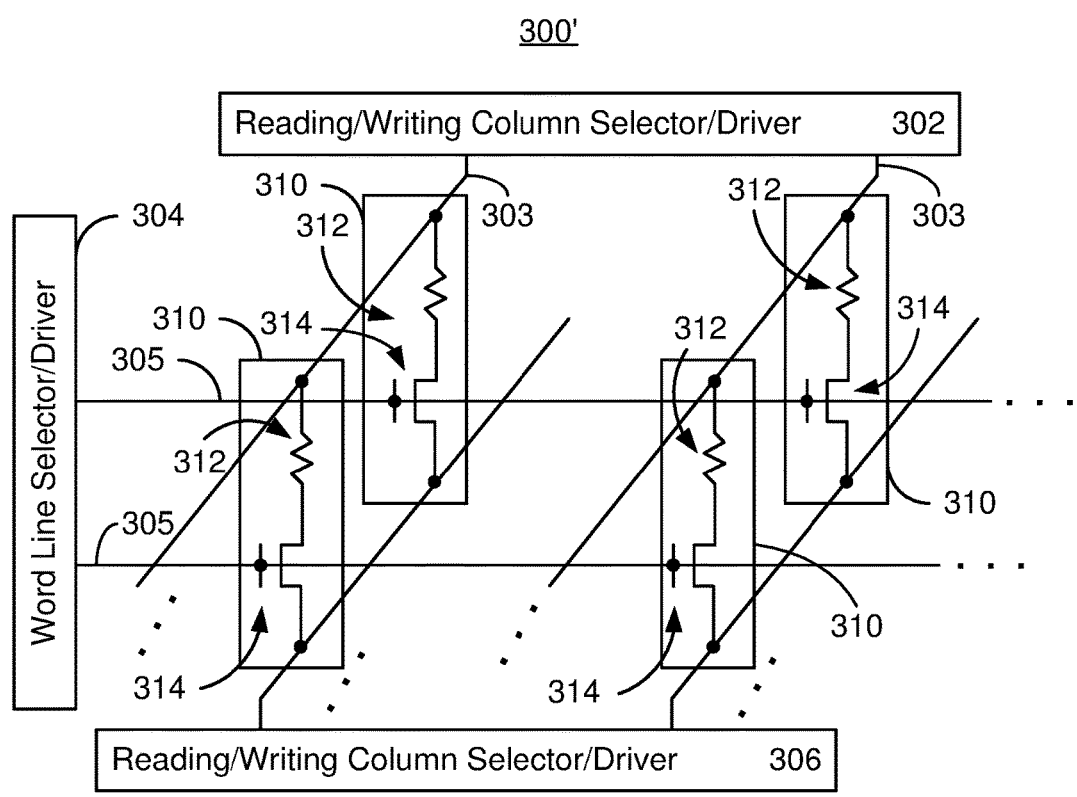
FIG. 9 depicts another exemplary embodiment of a magnetic device including magnetic junctions programmable using spin transfer and having an elongated free layer.

FIG. 9 depicts an exemplary embodiment of a memory 300 that may use one or more of the magnetic junctions 100, 100', 100" and/or 150. The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may be one of the magnetic junctions 100, 100', 100" and/or 150 disclosed herein. Although one magnetic junction 312 is shown per cell 310, in other embodiments, another number of magnetic junctions 312 may be provided per cell. As such, the magnetic memory 300 may enjoy the benefits described above.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction residing on a substrate and usable in a magnetic device comprising:
   a reference layer;
   a nonmagnetic spacer layer; and
   a free layer, the nonmagnetic spacer layer residing between reference layer and the free layer, the free layer having a length in a first direction, a width in a second direction, a height in a third direction substantially perpendicular to the first direction and the second direction, an aspect ratio and an exchange stiffness, the aspect ratio being the length divided by the width and being at least two, the exchange stiffness being not less than $2 \times 10^{-6}$ erg/cm such that the free layer does not exceed a critical size, the nonmagnetic spacer layer being between the reference layer and the free layer along the third direction;
   wherein the magnetic junction is configured such that the free layer is switchable between a plurality of stable magnetic states when a write current is passed through the magnetic junction.

2. The magnetic junction of claim 1 wherein the exchange stiffness is at least $3 \times 10^{-6}$ erg/cm.

3. The magnetic junction of claim 1 wherein the free layer has a thickness substantially perpendicular to the length and to the width, the thickness being at least 1.5 nanometers and not more than two nanometers.

4. The magnetic junction of claim 1 wherein the free layer is substantially free of glass-forming agents.

5. The magnetic junction of claim 1 wherein the width is not more than twenty nanometers.

6. The magnetic junction of claim 5 wherein the width is not more than sixteen nanometers.

7. The magnetic junction of claim 1 wherein the free layer includes at least one of Fe, Co, $SmCo_5$, MnGe, $Co_2FeSi$, $Co_2MnSi$, $Fe_xCo_{1-x}$ where x is at least 0.5 and less than 0.65.

8. The magnetic junction of claim 1 wherein the free layer has an elliptical footprint.

9. The magnetic junction of claim 1 wherein the reference layer and the nonmagnetic spacer layer have the aspect ratio.

10. The magnetic junction of claim 1 wherein the free layer has a thermal stability factor of at least one hundred.

11. The magnetic junction of claim 1 further including:
    an additional nonmagnetic spacer layer, the free layer being between the nonmagnetic spacer layer and the additional nonmagnetic spacer layer; and
    an additional reference layer, the additional nonmagnetic spacer layer being between the free layer and the additional reference layer.

12. The magnetic junction of claim 1 wherein the reference layer has a reference layer length in the first direction and a reference layer width in the second direction, at least one of the reference layer length being greater than the length of the free layer and the reference layer width being greater than the width of the free layer and wherein the free layer has a perpendicular magnetic anisotropy energy greater than an out-of-plane demagnetization energy.

13. A magnetic memory comprising:

a plurality of magnetic storage cells, each of the plurality of magnetic storage cells including at least one magnetic junction, the at least one magnetic junction including a reference layer, a nonmagnetic spacer layer and a free layer, the nonmagnetic spacer layer residing between reference layer and the free layer, the free layer having a length in a first direction, a width in a second direction, a height in a third direction substantially perpendicular to the first direction and the second direction, an aspect ratio and an exchange stiffness, the aspect ratio being the length divided by the width and being at least two, the exchange stiffness being not less than $2\times10^{-6}$ erg/cm such that the free layer does not exceed a critical size, the magnetic junction being configured such that the free layer is switchable between a plurality of stable magnetic states when a write current is passed through the magnetic junction, the nonmagnetic spacer layer being between the reference layer and the free layer along the third direction;

a plurality of bit lines coupled with the plurality of magnetic storage cells.

14. The magnetic memory of claim 13 wherein the reference layer has a reference layer length in the first direction and a reference layer width in the second direction, at least one of the reference layer length being greater than the length of the free layer and the reference layer width being greater than the width of the free layer and wherein the free layer has a perpendicular magnetic anisotropy energy greater than an out-of-plane demagnetization energy.

15. A method for providing a magnetic junction residing on a substrate and usable in a magnetic device, the method comprising:

providing a reference layer;

providing a nonmagnetic spacer layer; and providing a free layer, the nonmagnetic spacer layer residing between reference layer and the free layer, the free layer having a length in a first direction, a width in a second direction, a height in a third direction substantially perpendicular to the first direction and the second direction, an aspect ratio and an exchange stiffness, the aspect ratio being the length divided by the width and being at least two, the exchange stiffness being not less than $2\times10^{-6}$ erg/cm such that the free layer does not exceed a critical size, the nonmagnetic spacer layer being between the reference layer and the free layer along the third direction;

wherein the magnetic junction is configured such that the free layer is switchable between a plurality of stable magnetic states when a write current is passed through the magnetic junction.

16. The method of claim 15 wherein the exchange stiffness is at least $3\times10^{-6}$ erg/cm.

17. The method of claim 15 wherein the width is not more than twenty nanometers.

18. The method of claim 15 wherein the free layer has an elliptical footprint.

19. The method of claim 15 wherein the reference layer and the nonmagnetic spacer layer have the aspect ratio.

20. The method of claim 15 wherein the reference layer has a reference layer length in the first direction and a reference layer width in the second direction, at least one of the reference layer length being greater than the length of the free layer and the reference layer width being greater than the width of the free layer and wherein the free layer has a perpendicular magnetic anisotropy energy greater than an out-of-plan demagnetization energy.

* * * * *